(12) United States Patent
Dooley et al.

(10) Patent No.: US 9,583,432 B2
(45) Date of Patent: Feb. 28, 2017

(54) INTERCONNECTS THROUGH DIELECRIC VIAS

(71) Applicant: Hewlett-Packard Development Company, L.P., Houston, TX (US)

(72) Inventors: Kevin Dooley, Blessington Co. Wicklow (IE); Roger McQuaid, Mullingar (IE); Liam Cheevers, Leixlip (IE); David Fitzpatrick, Rathfeigh (IE); Lorraine Byrne, Dublin (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/762,799

(22) PCT Filed: Jan. 29, 2013

(86) PCT No.: PCT/US2013/023586
§ 371 (c)(1),
(2) Date: Jul. 22, 2015

(87) PCT Pub. No.: WO2014/120118
PCT Pub. Date: Aug. 7, 2014

(65) Prior Publication Data
US 2016/0104675 A1   Apr. 14, 2016

(51) Int. Cl.
| H01L 23/00 | (2006.01) |
| H01L 23/522 | (2006.01) |
| H01L 23/532 | (2006.01) |
| H01L 21/768 | (2006.01) |
| H01L 23/528 | (2006.01) |
| H01L 27/12 | (2006.01) |

(52) U.S. Cl.
CPC .... *H01L 23/5226* (2013.01); *H01L 21/76802* (2013.01); *H01L 21/76828* (2013.01); *H01L 21/76877* (2013.01); *H01L 23/528* (2013.01); *H01L 23/5329* (2013.01); *H01L 27/1214* (2013.01); *H01L 2924/0002* (2013.01)

(58) Field of Classification Search
CPC ...................................... H01L 23/48
See application file for complete search history.

(56) References Cited

U.S. PATENT DOCUMENTS

| 4,753,866 A | * 6/1988 | Welch ........ G03F 7/40 |
| | | 257/E21.241 |
| 5,710,061 A | 1/1998 | Cleeves |

(Continued)

FOREIGN PATENT DOCUMENTS

| EP | 2395551 | 12/2011 |
| JP | 02-122589 A | 5/1990 |

(Continued)

OTHER PUBLICATIONS

International Search Report, Korean searching authority, Oct. 28, 2013, PCT Patent Application No. PCT/US2013/023586.

(Continued)

*Primary Examiner* — William Harriston
(74) *Attorney, Agent, or Firm* — HP Inc. Patent Department

(57) ABSTRACT

A dielectric layer includes a reflow via. The reflow via is formed by reflow of the dielectric layer. An interconnect is in contact through the reflow via.

14 Claims, 10 Drawing Sheets

(56) References Cited

U.S. PATENT DOCUMENTS

| | | |
|---|---|---|
| 5,960,315 A | 9/1999 | Gambino et al. |
| 6,153,936 A | 11/2000 | Chao |
| 6,261,963 B1 | 7/2001 | Zhao et al. |
| 6,977,805 B2 | 12/2005 | Takada et al. |
| 7,427,560 B2 | 9/2008 | Lin et al. |
| 7,795,131 B2 | 9/2010 | Huang et al. |
| 8,003,515 B2 | 8/2011 | Meyer et al. |
| 2003/0168746 A1 | 9/2003 | You |
| 2005/0170565 A1 | 8/2005 | Fujii et al. |
| 2006/0160278 A1 | 7/2006 | Mei |

FOREIGN PATENT DOCUMENTS

| | | |
|---|---|---|
| JP | 06-006032 A | 1/1994 |
| JP | H066032 A | 1/1994 |
| JP | 2004087991 | 3/2004 |
| JP | 2008-171856 A | 7/2008 |
| KR | 2000-0019708 A | 4/2000 |
| KR | 2009-0070789 A | 7/2009 |
| TW | 226474 B | 7/1994 |
| TW | 415004 B | 7/1998 |

OTHER PUBLICATIONS

Lerme, M., "Multi Layer Metallization," May 26, 1997. <http://www.imec.be/essderc/papers-97/314.pdf>.

\* cited by examiner

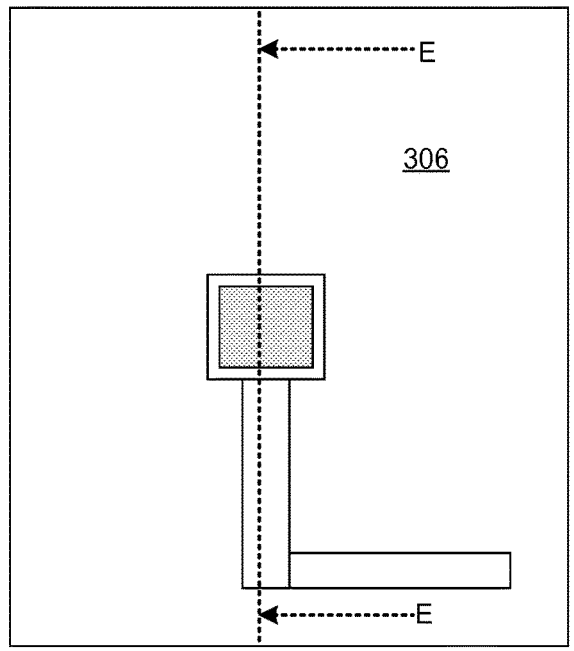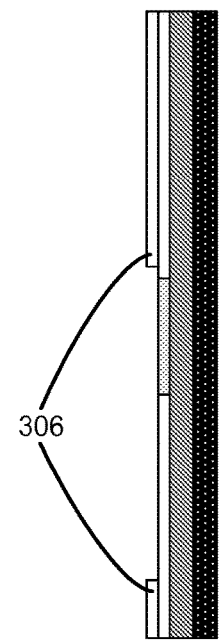
*FIG. 3E*  *FIG. 3F*
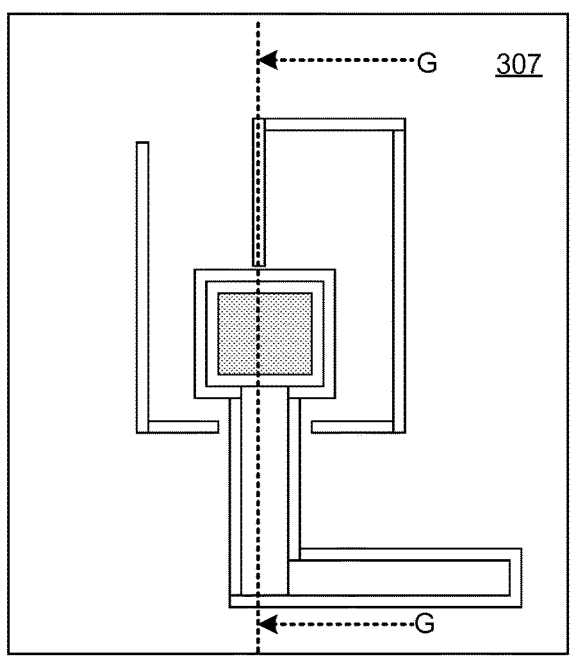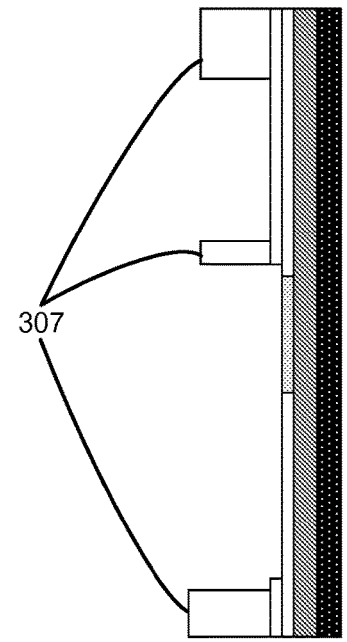
*FIG. 3G*  *FIG. 3H*

US 9,583,432 B2

INTERCONNECTS THROUGH DIELECRIC VIAS

CROSS-REFERENCE TO RELATED APPLICATION

This application is a U.S. National Stage Application of and claims priority to International Patent Application No. PCT/US2013/023586, filed on Jan. 29, 2013, and entitled "INTERCONNECTS THROUGH DIELECTRIC VIAS," which is hereby incorporated by reference in its entirety.

BACKGROUND

Electronic devices may be formed based on a variety of processes. A device may be limited to simplistic structures that lack interconnects. A device that contains an interconnect may be complicated to produce, resulting in low yields and poor quality, incompatible with more efficient processing techniques.

BRIEF DESCRIPTION OF THE DRAWINGS/FIGURES

DETAILED DESCRIPTION

Examples provided herein include a three dimensional (3-D) interconnect, e.g., an interconnect that extends across multiple levels. The interconnect may be formed in a reflow via of a dielectric layer of the device. 3-D interconnect structures are usable in many electronic applications, including electronic components, display applications, and so on. A 3-D metal interconnect may be formed between multiple metal layers on different levels of a device (an apparatus). The interconnect may extend the possibilities for devices, including those based on predefined patterns and self-aligned processing techniques (e.g., for roll-to-roll (R2R) processing). The interconnect enables creation of an entire device pattern in a single 3-D template, avoiding a need for layer-to-layer alignment. Thus, example devices having the interconnect even may be based on a substrate having a low dimensional stability, such as flexible polymer and paper.

Figure 1:
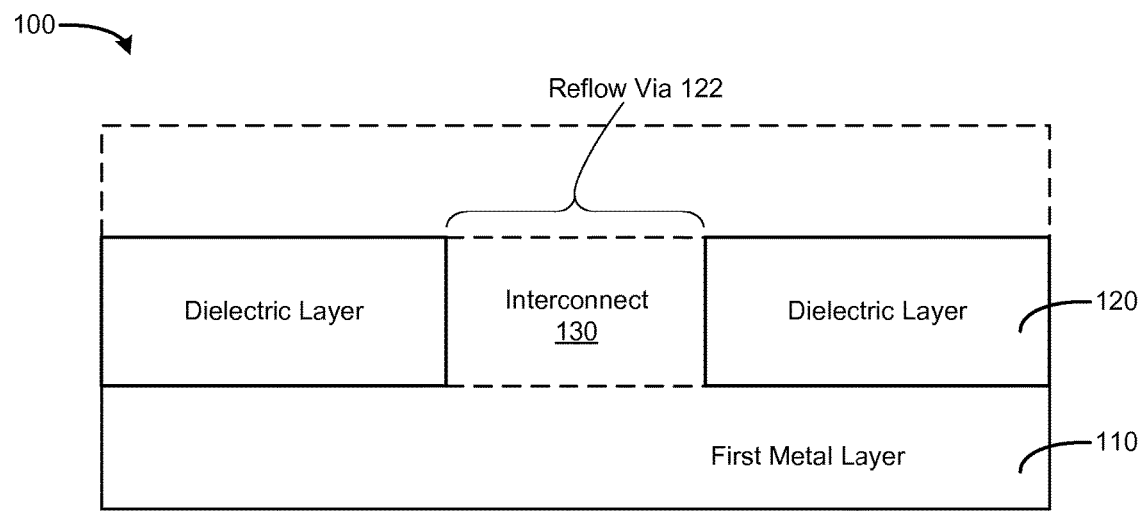
FIG. 1 is a block diagram of an apparatus including a reflow via according to an example.

FIG. 1 is a block diagram of an apparatus 100 including a reflow via 122 according to an example. Apparatus 100 also includes a first metal layer 110, a dielectric layer 120 disposed on the first metal layer 110, and an interconnect 130 in contact with the first metal layer 110 through the reflow via 122. The reflow via 122 may be formed based on reflow of the dielectric layer 120, and examples provided herein enable selectively locating the reflow via 122 to provide the interconnect 130 where desired on the apparatus 100 (e.g., where an electrical connection is to be made between different layers of an inductor, passing through an insulator such as a dielectric layer).

The dielectric layer 120 may be a polymeric dielectric material including, but not limited to, a UV curable polymeric resist material or a thermally curable polymer film. For example, the dielectric layer 120 may be formed of SU-8, an epoxy-based, near-UV, negative photoresist available from Micro-Chemical Corporation. The dielectric layer 120 may be formed using various techniques, such as electrophoretic deposition. In alternate examples, the dielectric layer 120 may be formed based on alignment and inkjet printing of the dielectric layer 120 over the first metal layer 110, and/or screen printing down a thin layer of dielectric over the first metal layer 110.

Apparatus 100 may be implemented in devices such as passive circuit elements, active circuit elements, and crossover elements. The active circuit elements may include thin film transistors (e.g., field effect transistors or bipolar junction transistors) and diodes. The passive circuit elements may include conductor traces, resistors, capacitors, and inductors. Various features of the apparatus 100 may be formed based on electroplating, electrodeposition, electroless deposition, and/or electrophoretic deposition. The apparatus 100 may include a plurality of surface levels that coexist in a three-dimensional arrangement, which may facilitate the manufacture of template circuitry, for example.

Figure 2:
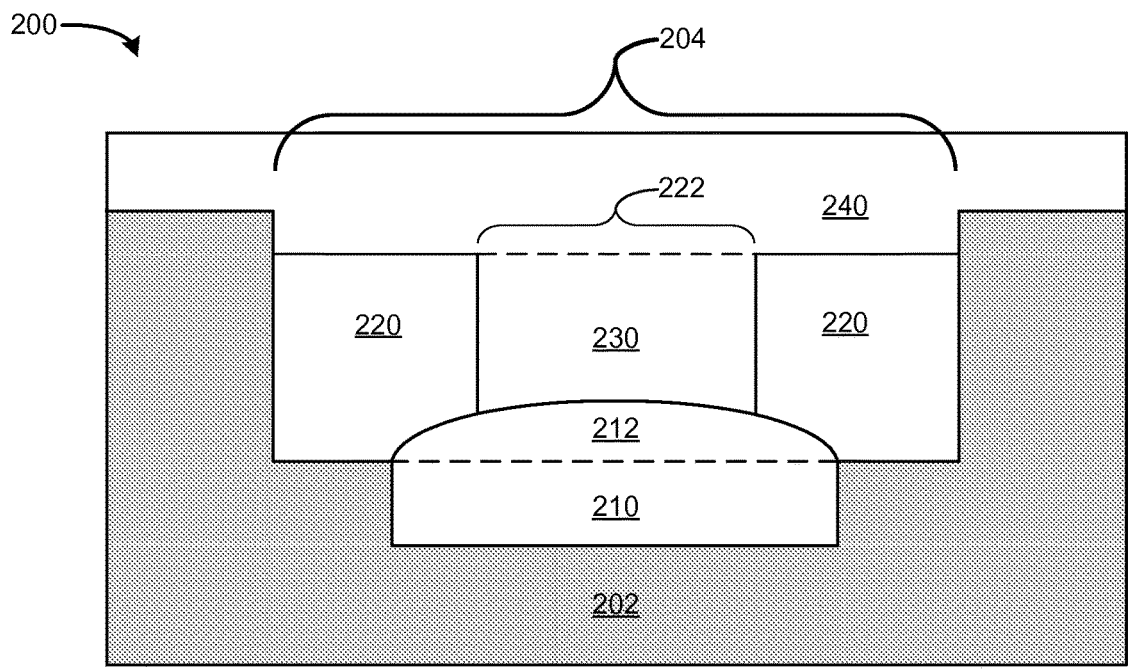
FIG. 2 is a block diagram of an apparatus including a reflow via according to an example.

FIG. 2 is a block diagram of an apparatus 200 including a reflow via 222 according to an example. Apparatus 200 also includes a substrate 202, a first metal layer 210 disposed on the substrate, and a raised feature 212 disposed on the first metal layer 210. Dielectric layer 220 is disposed on the raised feature 212, and includes the reflow via 222. Interconnect 230 is formed in the reflow via 222, in contact with the raised feature 212 and second metal layer 240. Second metal layer 240 is disposed on the dielectric layer 220. Containment region 204 is to contain at least a portion of the dielectric layer 220 (and may include features to contain, e.g., the first metal layer 210 and others).

In an example, apparatus 200 may be formed using a templated electroforming approach, in which first metal layer 210, raised feature 212, dielectric layer 220, and second metal layer 240 are formed in a 3-D polymer resist template by successive steps of electroplating, resist etch, electrophoretic deposition of dielectric and thermal reflow. The apparatus 200 may be etched using a dry etching technique, including plasma etching, reactive ion etching, laser ablation, focused ion beam etching, and/or electron beam etching.

The reflow via 222 may be formed by reflow of the dielectric (and/or dielectric removal at an increased rate relative to surrounding regions) to expose at least a portion of the first metal layer 210 (e.g., by exposing at least a portion of the raised feature 212 formed on the first metal layer 210. In alternate examples, the raised feature 212 may be omitted). The reflow via 222 is to enable formation of the interconnect 230, which may be formed, e.g., by electroplating the second metal layer 240 into the reflow via 222. Thus, the interconnect 230 may connect the first metal layer 210 (e.g., through the raised feature 212) to the second metal layer 240. Apparatus 200 may use three separate metal layers and a dielectric layer contained in a predefined polymer structure formed as part of the substrate 202. Thus, reflow via 222 and interconnect 230 may enhance and extend templated self-aligned processes, including containment for crossover plating and design of high process yield layouts.

Example interconnects 230 may be produced using self-aligned patterning and deposition techniques, enabled by reflow and/or differing etching rate of dielectric layer 220 relative to other geometrically distinct regions of the dielectric layer 220. Dielectric material may be selectively removed to expose and enable contact with a layer (e.g., first metal layer 210 and/or raised feature 212) that is underlying the dielectric layer 220. Other portions of the dielectric layer 220 may remain disposed on the underlying layer, to provide insulation and/or other dielectric functions (capacitance).

The raised feature 212 may be positioned on underlying layers as desired, for locating formation of the reflow via 222. The raised feature 212 may be a dome or other shapes including, e.g., a block, a pyramid, and so on. The raised feature 212 may encourage reflow of the dielectric layer 220 to occur, progressing from a center region of the raised feature 212 toward an outer region of the raised feature 212 (e.g., based on gravity). In alternate examples, the first metal layer 210 and/or the raised feature 212 may be sized relatively larger than surrounding geometrically distinct regions. The raised feature 212 may be omitted. The dielectric layer 220 then may be etched, wherein the relatively larger area of the first metal layer 210 etches at a faster rate than the relatively smaller surrounding regions that are geometrically distinct from the first metal layer 210 region, to form the reflow via 222. Surrounding regions may be considered geometrically distinct when, e.g., they are formed as a separate shape, size, area, or otherwise showing a difference in shape from another region. In an example, a large square first metal layer region may be considered geometrically distinct from an adjacent region that is narrower and rectangular, even though the two regions are physically connected to each other.

Upon exposing the region underlying the dielectric layer 220 by creating the reflow via 222, the interconnect 230 then may be formed in the reflow via 222. Thus, reflow and/or etching of the dielectric layer 220 may produce template patterns with metal electro-deposition, etch and dielectric electro deposition in a preformed template to produce devices (e.g., thin film transistor (TFT) and crossover array devices) for flexible electronics and roll-to-roll (R2R) processing.

Such template patterns may be used on the substrate 202. The substrate 202 may be formed of material that includes glass, ceramic, plastic, and/or other materials (polymerics). The substrate 202 may be a low temperature material (e.g., withstands temperatures up to 150 degrees C.) and/or a high temperature material (e.g., withstands temperatures greater than 150 degrees C.). The substrate 202 may be flexible, rigid, semi-rigid, optically transparent, translucent, non-transparent, and/or opaque. The substrate 202 may include and/or be bonded using an adhesive, including ultraviolet (UV)-curable polymer adhesive such as polyacrylates and/or epoxy, a pressure sensitive adhesive film, and/or a thermally curable adhesive. The adhesive may be applied either in dry film format using a pressurized lamination roller or as a liquid film by standard liquid coating techniques. The adhesive may be optically transparent, translucent, and/or opaque.

The substrate 202 may include a conductive carrier (e.g., a plate) that has a conductive surface (e.g., upon which the first metal layer 210, or other layers, are formed). For example, the carrier may be a planar stainless steel plate or other conductive metal, whose conductive surface may include a low-resistivity metal, such as copper, nickel, gold, silver, and/or a combination of two or more thereof (including alloys comprising one or more of the above, coated on a surface of the carrier). The template three-dimensional structure of the substrate 202 extending upward may be formed on the conductive surface of the conductive carrier of the substrate 202. In an example, the template structure is formed from a polymeric dielectric material.

Features of the apparatus 200 may be formed using techniques such as lithography, electroplating, metal deposition, and so on. Lithography may be compatible with putting down a photo layer, then a metal layer, then a next photo layer, a next metal layer, and so on. Electroplating is compatible with use of a 3-D pattern structure that is laid down on the substrate 202 in a single pass. Thus, electroplating enables all layers to be patterned together such that use of electroplating, in forming the apparatus 200 (to include the reflow via 222 and interconnect 230), may enable elimination of a need for several processes that would be used in, e.g., photolithography.

The apparatus 200 may be formed based on an additive process, thereby increasing efficiency and avoiding waste (e.g., compared to a metal deposition process that includes subtractive processes to remove large portions of a layer). For example, in metal deposition, a resist pattern is laid down, and an entire substrate surface is coated in a metal layer. Then, portions of that metal layer are etched away and lost. That process is repeated for subsequent layers, using metal deposition across entire surfaces of a layer. In contrast, using an additive process such as electroplating, enables application of a material selectively where desired, without a need to coat an entire surface of a layer only to have its majority be etched away. Materials such as metal (and dielectric) may be applied selectively using additive processing techniques.

The apparatus 200 may include a containment region 204. The containment region 204 may contain, e.g., the first metal layer 210 formed in the substrate 202, and/or the dielectric layer 220 (e.g., when formed and also when reflowed). The containment region 204 may be provided, e.g., as a recessed trench feature to physically contain features, to control the lateral dimensions/expansions of features, and/or to enclose features that reflow.

In an example, the containment region 204 may be formed by embossing a multilevel structure into the substrate 202 (which may include various levels of structure applied to build up and/or augment the substrate). The containment region 204 may be included in a multilevel embossed pattern to be formed in the substrate 202, e.g., by forming walls of the containment region 204. In alternate examples, the containment region 204 may be formed by multiple instances of photolithography and electroplating. Structures may be used to create and/or deposit, e.g., a pattern of metal lines using successive photolithography and electroplating steps. Subsequent photolithography steps may follow, to define various structures such as walls of the containment region 204. In an alternate example, the containment region 204 may be formed based on a combination of photolithography and laser ablation. For example, a main pattern of metal lines may be deposited using a photolithography and electroplating as in the previous example. Following the first level of plating, a single photolithography step may be used to define various patterns, and a relatively thicker resist layer may be used compared to the previous example to build up structures. The containment region 204 then may be created using laser ablation.

Figure 3A:
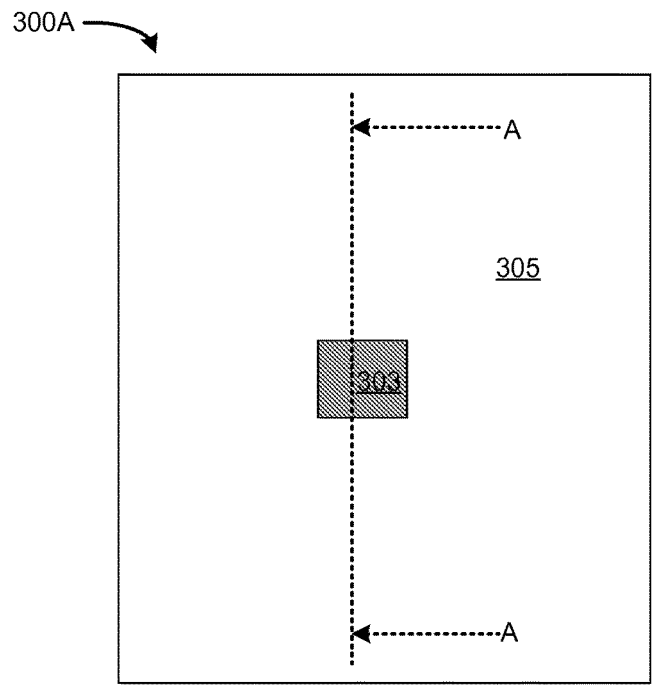
FIGS. 3A-3T show a block diagram of an apparatus including a reflow via according to an example.
Figure 3B:
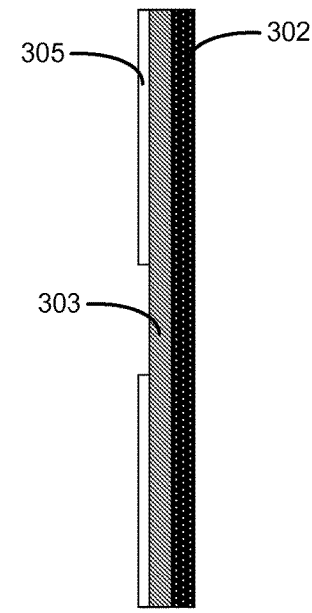
Figure 3C:
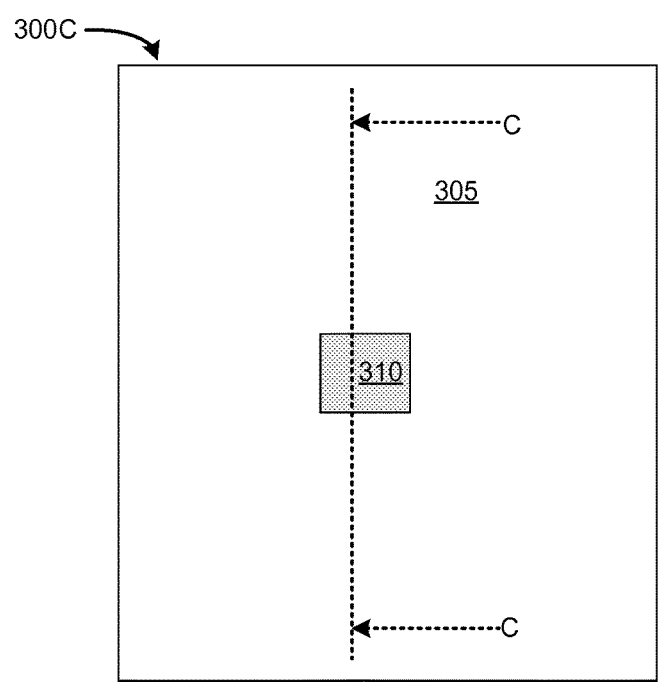
Figure 3D:
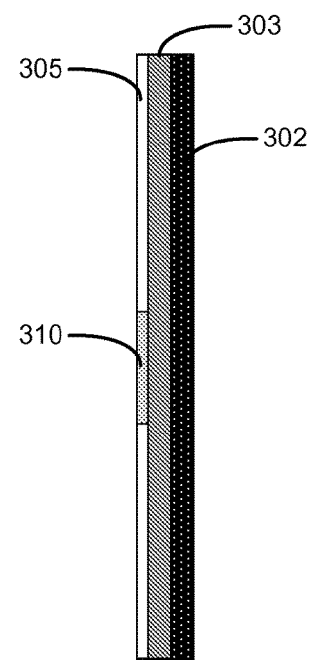
Figure 3I:
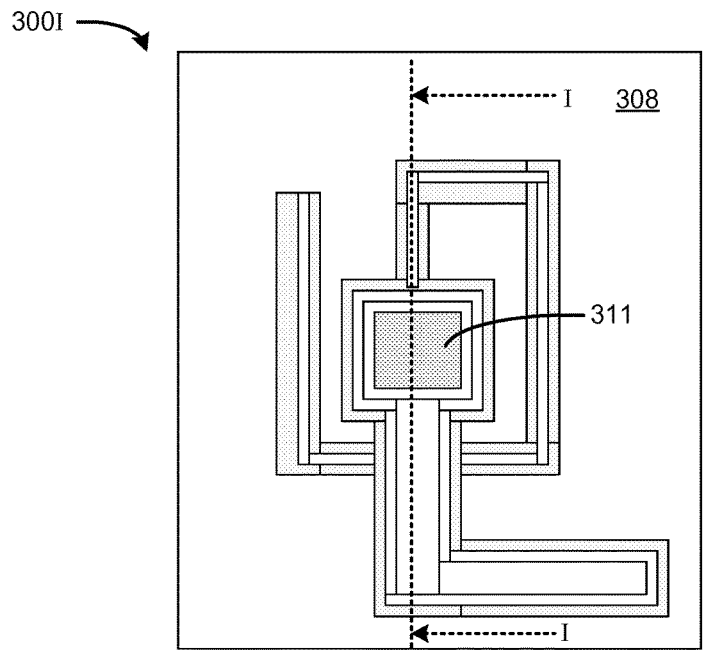
Figure 3J:
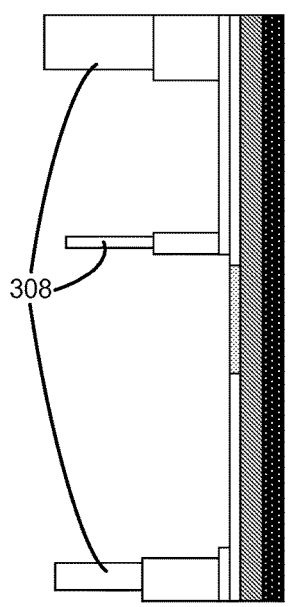
Figure 3K:
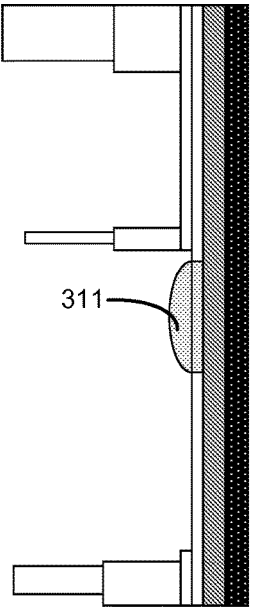
Figure 3L:
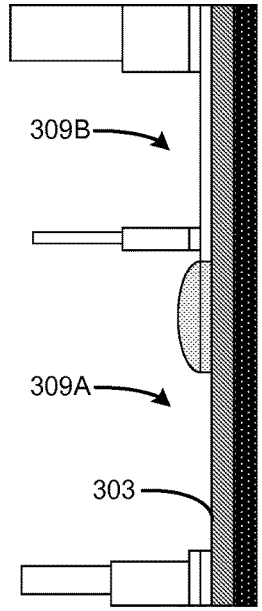
Figure 3M:
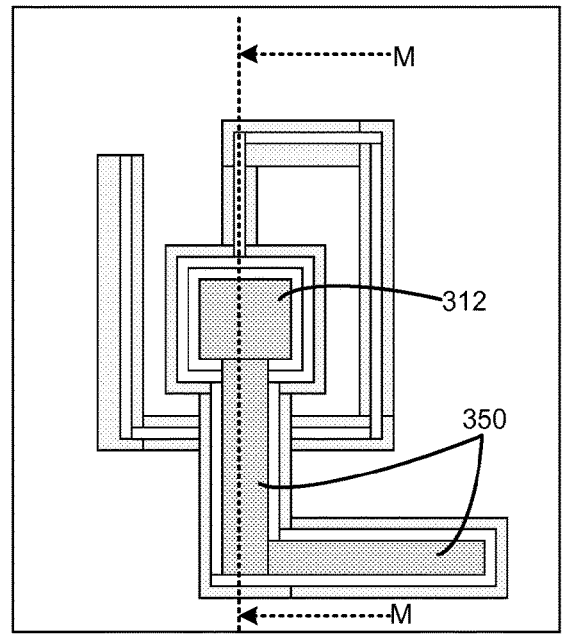
Figure 3N:
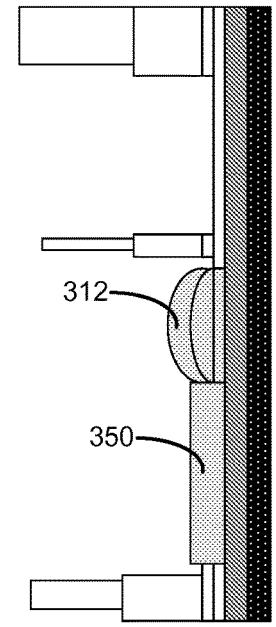
Figure 3O:
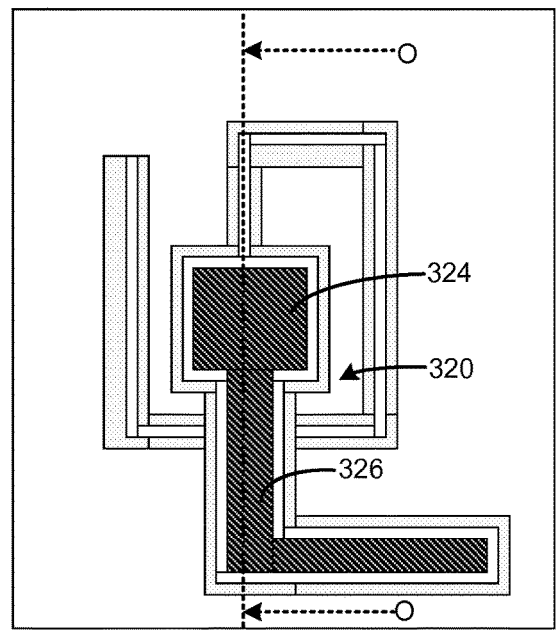
Figure 3P:
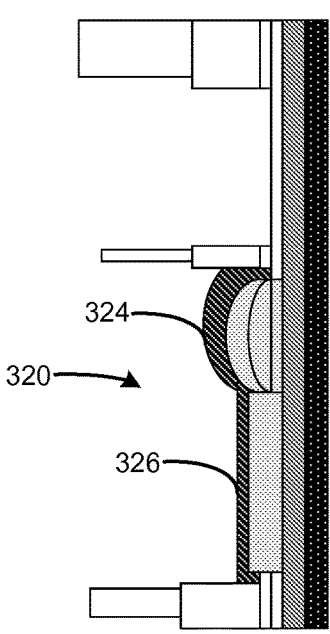
Figure 3Q:
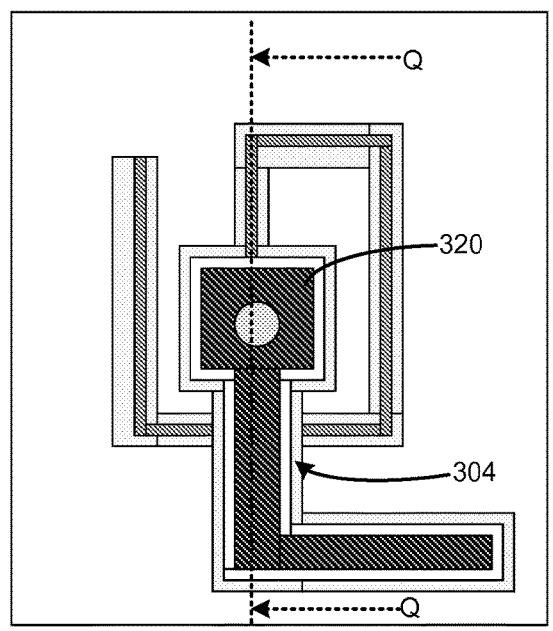
Figure 3R:
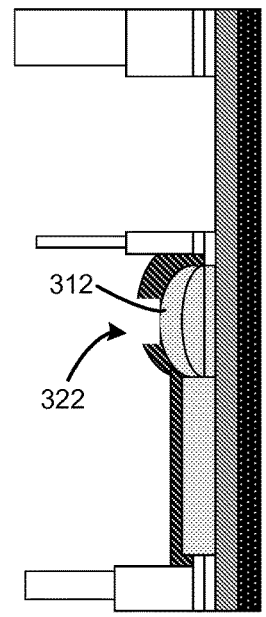
Figure 3S:
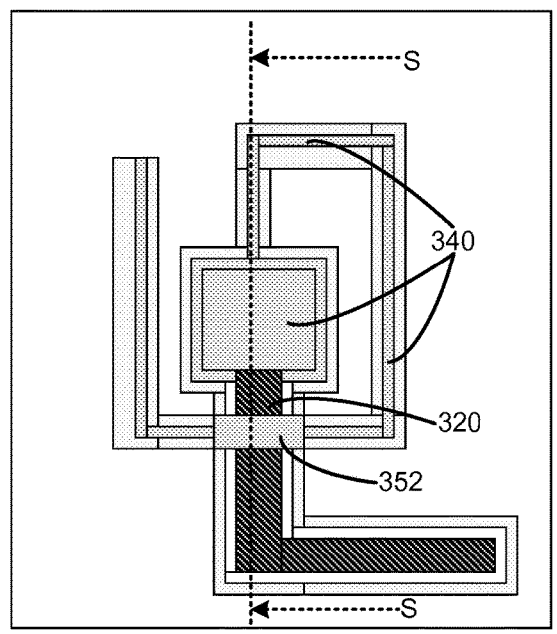
Figure 3T:
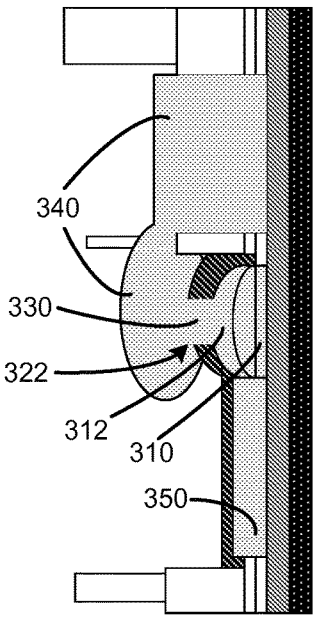

FIGS. 3A-3T show a block diagram of an apparatus 300 including a reflow via according to an example. Apparatus 300 may be formed based on photo patterning to create a plurality of three-dimensional levels, although in alternate examples the plurality of levels may be formed using other techniques (e.g., being provided as a three dimensional patterned structure that is formable self-aligned in a substrate, e.g., based on embossing with a template and/or roll-to-roll processing). As the example of FIGS. 3A-3T, an inductor apparatus 300 is presented based on the formation of a three dimensional template with multiple layers on a conductive surface. The example inductor structure demonstrates creation of multiple metal layers, with some metal layers connected together by an interconnect.

FIG. 3A shows a top view of apparatus 300A including a base metal layer 303 and a first resist layer 305. FIG. 3B shows a side view of apparatus 300A along line A-A, illustrating first resist layer 305 disposed on base metal layer 303, which is disposed on substrate 302. In an example, the first resist layer 305 may be formed by photoresist SU8-2 spun on at 4500 revolutions per minute (rpms) to produce a thickness of approximately 0.8 microns.

The base metal layer 303 of the substrate 302 is metallic, and polymer subsequently may be selectively built up and/or patterned to provide three dimensional structures and/or exposures of metal traces. Exposed metal traces may be used, and additional metal may be added (e.g., using an electroplating process). A dielectric layer may be added (e.g., using electrofluoretic deposition), to be reflowed to form a reflow via and interconnect.

FIG. 3C shows a top view of apparatus 300C including first metal layer 310. FIG. 3D shows a side view of apparatus 300C along line C-C, illustrating that first metal layer 310 may be disposed on the base metal layer 303. In an example, first metal layer 310 may be formed by electroplating nickel (Ni) to a thickness approximately equal to a thickness of the first resist layer 305. In alternate examples, a thickness of first metal layer 310 may differ from a thickness of the first resist layer 305 (e.g., by approximately 0.5 microns or more). In an example, the first metal layer 310 is plated higher/thicker than the first resist layer 305. The electroplating of the first metal layer 310 may be carried out at 56 degrees Centigrade (C) for fifteen seconds (S) at 0.5 amps (A), and again for 20 S at 0.3 A.

FIG. 3E shows a top view of apparatus 300E including second resist layer 306. FIG. 3F shows a side view of apparatus 300E along line E-E, illustrating a relative thickness of the second resist layer 306. In an example, the second resist layer 306 may be formed by photoresist SU8-2 spun on at 4500 rpms to produce a thickness of approximately 0.8 microns.

FIG. 3G shows a top view of apparatus 300G including third resist layer 307. FIG. 3H shows a side view of apparatus 300G along line G-G. In an example, third resist layer 307 may be formed of photoresist SU8-10, spun on at 3300 rpms for 6 minutes to produce a thickness of approximately 7 microns.

FIG. 3I shows a top view of apparatus 300I including fourth resist layer 308 and first raised feature 311. FIG. 3J shows a side view of apparatus 300I along line I-I. In an example, fourth resist layer 308 may be formed of photoresist SU8-10, spun on at 3300 rpms for 6 minutes to produce a thickness of approximately 7 microns. FIG. 3K shows a side view of apparatus 300I along line I-I, illustrating first raised feature 311. In an example, first raised feature 311 may be formed by plating up a dome of nickel, e.g., a thickness of approximately 2 microns of nickel formed by electroplating at 56 degrees C. for 30 S at 0.5 A, and again for 40 S at 0.3 A. FIG. 3L shows a side view of apparatus 300I along line I-I, illustrating etched regions 309A, 309B to expose underlying layers (e.g., a portion of the base metal layer 303). In an example, multiple (e.g., four) regions may be etched. The base metal layer 303 may be exposed by etching, in preparation for subsequent electroplating.

FIG. 3M shows a top view of apparatus 300M including second raised feature 312 and additional metal layer regions 350. FIG. 3N shows a side view of apparatus 300M along line M-M, illustrating second raised feature 312 and additional metal layer region 350. In an example, the second raised feature 312 and the additional metal layer regions 350 may be formed as the same layer by electroplating a thickness of approximately 2 microns of nickel at 56 degrees C., for 30 S at 0.5 A and 40 S at 0.3 A. In alternate examples, the second raised feature 312 and the additional metal layer regions 350 may be formed separately (e.g., as different layers and/or metals). The second raised feature 312 is to rise above the additional metal layer regions 350.

The raised feature 312 is shown as a dome. However, other techniques and shapes may be used to obtain the raised feature 312, including a flat raised feature. Electroless plating may be used to plate up a flat surface that may not be domed, to raise the surface up above surrounding regions. Areas may be masked-off to enable selective application of metal for raising up the raised feature 312.

FIG. 3O shows a top view of apparatus 300O including dielectric layer 320, including a first region 324 geometrically distinct from a second region 326 (a third, unlabeled, region of the dielectric layer 320 also is shown, and other regions may be included). FIG. 3P shows a side view of apparatus 300O along line O-O, illustrating the first region 324 of the dielectric layer 320 geometrically distinct from the second region 326. The dielectric layer 320 may be electro-depositable, to attach to metals (and not the resist layers) due to an electrophoretic effect.

FIG. 3Q shows a top view of apparatus 300Q including reflow via 322 contained in the dielectric layer 320. FIG. 3R shows a side view of apparatus 300Q along line Q-Q, illustrating that the reflow via 322 is to expose a portion of the underlying raised feature 312. In an example, the reflow via 322 may be formed by heating the dielectric layer 320 such that the dielectric layer 320 reaches or exceeds a glass transition temperature (Tg). For example, the apparatus 300Q may be baked at 80 degrees C. for 20 minutes to reflow the dielectric 320 to form the reflow via 322.

The dielectric layer 320 may have a glass transition temperature to enable reflow transition at a bake temperature (e.g., approximately 80 degrees C.). The apparatus 300 may be processed at some point based on meeting and/or exceeding the glass transition temperature, and may include a melting procedure to reflow the dielectric layer 320. However, production of the apparatus may achieve dielectric reflow as part of another procedure (e.g., to bake another feature of the apparatus that is not specifically dedicated to the dielectric layer 320). Thus, it is possible to get "double-duty" out of a baking process to also accomplish reflow of the dielectric layer 320 to create the reflow via 322. If the glass transition temperature of the dielectric layer 320 exceeds a baking temperature of a particular bake, it may be possible to adjust the bake procedure to use a higher temperature to provide reflow of the dielectric layer 320 during that bake.

The dielectric layer 320 may reflow away from the top of the raised feature 312 to expose at least a portion of the raised feature 312, and may reflow toward a containment region 304, based on the raised feature 312 being higher than a surrounding surface (e.g., higher than containment region 304). A thickness of the dielectric layer 320 may be made sufficient to withstand subsequent etching or other procedures (e.g., etching of additional patterned layers). Reflow to the containment region 304 may provide greater dielectric protection at the containment region 304 compared to pre-reflow conditions, and may provide other features such as greater capacitance where reflow was contained. The raised feature 312 is depositable anywhere dielectric reflow is desired, for locating an interconnect to occupy the reflow via 322.

FIG. 3S shows a top view of apparatus 300S including second metal layer 340 and crossover 352. In an example, the crossover 352 may be formed from the second metal layer 340, without a need for dedicated and/or separate processing to form the crossover 352. In alternate examples, the crossover 352 may be formed separately, e.g., as additional metal layer regions. The second metal layer 340 may be formed by electroplating nickel for approximately 1,500 S. The dielectric layer 320 is to electrically isolate the crossover 352 from underlying additional metal layer region 350. FIG. 3T shows a side view of apparatus 300S along line S-S, illustrating the second metal layer 340, interconnect 330 formed in the reflow via 322, raised feature 312, first metal layer 310, and additional metal layer region 350. Thus, the second metal layer 340 is in contact with the first metal layer 310 via the interconnect 330 disposed on the raised feature 312. In an example, the interconnect 330 may be formed during formation of the second metal layer 340.

Thus, the interconnect 330 may enable formation of stacked crossover lines, and connections between one metal layer and another metal layer in a device. The interconnect 330 and crossover 352 may be formed using the same layer, thereby avoiding a need for separate processing to form the interconnect 330 and crossover 352.

The example inductor apparatus 300 demonstrates multiple metal layers including an interconnect and a crossover. Other example apparatuses may not need all of these features, and some features may be omitted. For example, metal layers need not interconnect, and reflow channels may be formed to allow dielectric reflow away from a metal layer. Walled structures may be designed to prevent interconnection of the electroplated structures.

In post processing, the apparatus may be transferred to a polymer substrate. In follow-on processing, an adhesive layer may be applied to at least a portion of a surface of the apparatus, a polymer layer may be laminated onto the adhesive layer, and the entire stack may be peeled from the conductive surface enabled by a sacrificial metal peel and transfer process. Such a flexible electronic circuit may be used independently or attached to other electronic devices, integrated circuit (IC) chips, or other devices. The first metal layer may be used as an electrical interconnect between other laminated substrates or IC chips. It is possible to integrate other circuit elements into the flexible circuit, such as sensors, TFT devices, capacitors, resistors, display arrays, and the like.

Figure 4:
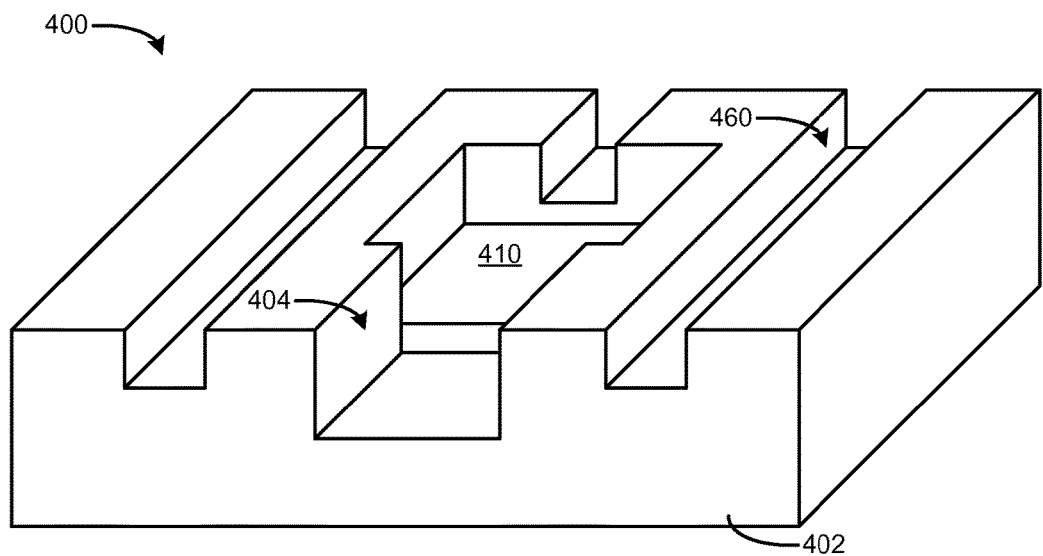
FIG. 4 is a perspective view of an apparatus including a containment region according to an example.

FIG. 4 is a perspective view of an apparatus 400 including a containment region 404 according to an example. Apparatus 400 may be formed based on providing a plurality of three dimensional levels, e.g., as a three dimensional patterned structure that is formable self-aligned in a substrate (e.g., embossed using roll-to-roll processing). However, in alternate examples, other techniques may be used to create the plurality of three-dimensional levels (e.g., photo patterning). Apparatus 400 may include a substrate 402, the containment region 404, a channel 460, and a first region 410 (e.g., to contain a first metal layer, such as a raised feature and/or a relatively larger geometric region). The various features may be provided at different 3-D levels, e.g., at different heights from the first region 410 relative to a base of the substrate 402. Channel 460 may contain external features, such as a metal III layer formed as part of an inductor coil or other feature of the apparatus.

The first region 410 may be relatively larger in area than the containment region 404, which is geometrically distinct from the first region 410. The relative difference in area may affect the rate of etch of an overlying dielectric layer. For example, the relatively larger area of the first region 410 may result in a relatively higher rate of etch, to help with the breakthrough of the dielectric layer corresponding to the first region 410, compared to the dielectric layer corresponding to the containment region 404 (which may remain intact without dielectric etch break through). Because the etch rate of the dielectric layer over larger features is higher than it is for smaller features, subjecting first region 410 to, e.g., a dry etch process such as a plasma etch, will etch the larger area more quickly than it will the smaller area. Also, when dielectric depositing, e.g., when electroplating the dielectric, higher current density may result in thicker fill-ins, which also may contribute to the desired dielectric and metal layer thickness features.

A raised feature may be formed in the first region 410, to cause the dielectric layer to reflow off the raised feature toward adjacent lower regions such as the containment region 404. Dielectric also may reflow into the channel 460.

Examples may be provided that use a first region 410 that is relatively larger in area than surrounding regions, without using a raised feature, to obtain a reflow via. Examples may combine the features of a relatively large first region 410, and a raised feature (dome) to obtain the reflow via. These features may contribute to the dielectric achieving a breakthrough to form the reflow via. Whether to include a particular feature(s) may be guided based on an amount of design space available at the apparatus. Thus, in an example, a reflow via may be achieved without a reflow step, relying on etching effects of the relatively larger first region 410.

By selectively patterning the substrate 402, the nature of the pattern itself may create areas which will have a higher current density during processing, causing more metal to deposit at those relatively larger areas compared to areas with lower current density. Deposition of the dielectric layer (e.g., electrofluoretic deposition) may rely on a different mechanism that functions inversely compared to the metal deposition, so the areas of high current density may result in depositing less dielectric than metal. Accordingly, this technique may be used to selectively enable controlled dielectric deposition to enable break-through where a reflow via is desired to enable formation of an interconnect—e.g., by forming the first region 410 to have a relatively larger relative area than surrounding regions.

Example apparatus 400 may be formed based on a self-aligned approach to devices having substantial uniformity compared to non-self-aligned approaches. The template system may include a 3-D template/embosser having multiple levels and multiple feature regions associated with the multiple levels. The template may be patterned with feature regions having substantially uniform sizes and substantially uniform distribution among the levels of the template. The template then may be pressed into the substrate 402 to form the corresponding structures as illustrated. Channels, regions, crossovers, and other features may be produced within the template system with substantial uniformity throughout the templated structure, without a separate need to align those features relative to each other (e.g., if produced in separate steps, whose results would need to be aligned between steps).

Templated electroforming may be used as a self-aligned approach, to deposit individual layers of materials in succession into a 3-D dielectric template. A deposition step may be electro, electrophoretic or electroless deposition. Additive deposition techniques such as slot coating, spray deposition and inkjet printing also may be incorporated. The photoresist template may be a multilevel structure formed on a conductive substrate. As individual layers are built up, individual levels within the template may be etched back to expose an underlying conductive substrate to allow for further electrodeposition. After patterning and deposition, a fully-formed templated structure may be transferred to a polymer substrate by a peel-off transfer process.

The substrate material 402 may be heated up to meet or exceed a glass transition temperature for the substrate 402, and an embossed roller containing a master template may be rolled into the substrate material 402 to leave behind the structure shown, containing various features as shown and described herein. Thus, misalignment between various features in the substrate 402 may be avoided, because the features are self-aligned.

Thus, examples shown may avoid a need for additional steps. For example, avoiding a need to separately mask and/or selectively remove dielectric, by virtue of the reflow via formation by baking. A need to align various features is avoided, by virtue of using self-aligned processing (e.g., roll-to-roll). Examples are not limited to use of roll-to-roll, and may use other techniques such as three-layer photo lithography (e.g., photolithography with electroplating on a rigid substrate). Multiple photolithographic, bake, and develop steps may be avoided, thereby increasing efficiency while enabling the use of a 3-D interconnect option to enable various electronic applications. Patterning may be carried out in a single step. Examples may be produced based on additive processing where material is selectively deposited as-needed, without a need to cover an entire layer and etch most of it away. Techniques are compatible with flexible (i.e., non-rigid) substrates and roll-to-roll processing for flexible electronics applications.

Figure 5:
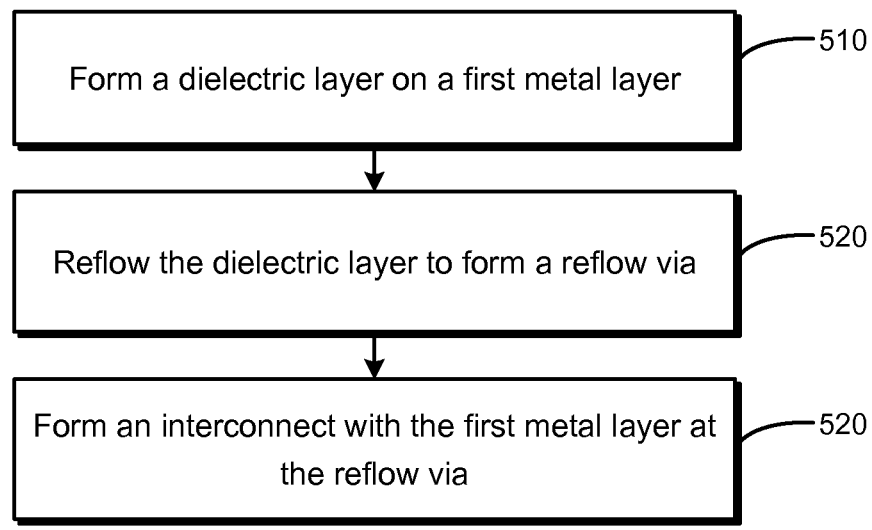
FIG. 5 is a flow chart based on reflowing a dielectric layer according to an example.

FIG. 5 is a flow chart 500 based on reflowing a dielectric layer according to an example. In block 510, a dielectric layer is formed on a first metal layer. In block 520, the dielectric layer is reflowed to form a reflow via. In block 530, an interconnect with the first metal layer is formed at the reflow via. Thus, an example may be provided wherein the dielectric is formed, a reflow is performed, and interconnects are formed by plating up metal.

Figure 6:
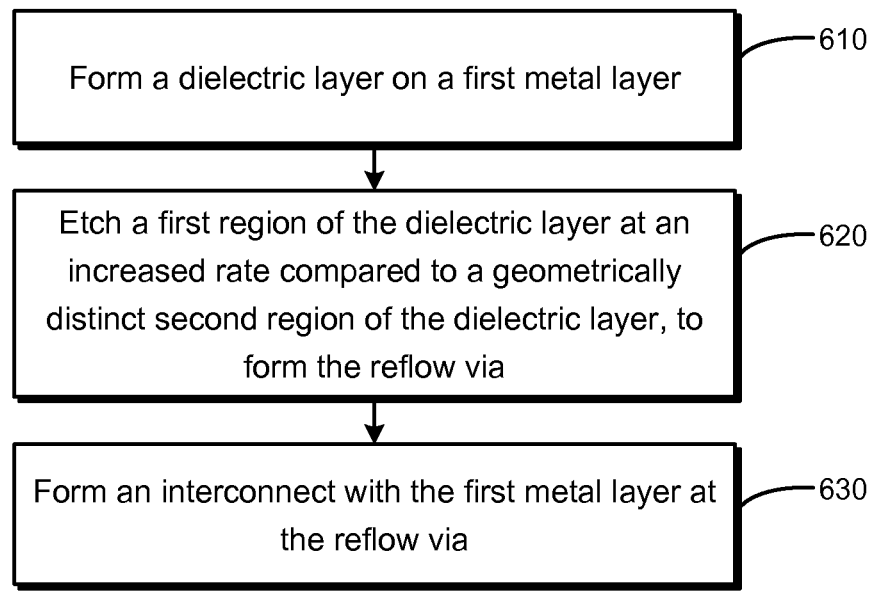
FIG. 6 is a flow chart based on etching a dielectric layer according to an example.

FIG. 6 is a flow chart based on etching a dielectric layer according to an example. In block 610, a dielectric layer is formed on a first metal layer. In block 620, a first region of the dielectric layer is etched at an increased rate compared to a geometrically distinct second region of the dielectric layer, to form the reflow via. In block 630, an interconnect with the first metal layer is formed at the reflow via. Thus, an example may be provided based on forming the dielectric layer, preferentially etching a large center feature, and then forming the interconnect.

What is claimed is:

1. An apparatus comprising:
    a first metal layer;
    a dielectric layer disposed on the first metal layer, wherein the dielectric layer includes a reflow via, formed by reflow of the dielectric layer;
    an interconnect in contact with the first metal layer through the reflow via; and
    a substrate including a containment region to contain reflow of the dielectric layer.

2. The apparatus of claim 1, wherein the dielectric layer includes a first region and a second region, wherein the first region is geometrically distinct from and larger in surface area than the second region, and wherein the reflow via is formed in the first region based on an increased rate of etch of the first region compared to the second region.

3. The apparatus of claim 1, further comprising a raised feature disposed on the first metal layer; wherein the reflow via is disposed on the raised feature.

4. The apparatus of claim 3, wherein the dielectric layer is reflowable upon reaching a glass transition temperature (Tg).

5. The apparatus of claim 3, wherein the raised feature is a dome.

6. The apparatus of claim 1, wherein the dielectric layer is electrodepositable based on an electrophoretic effect to cause the dielectric layer to attach to metal.

7. The apparatus of claim 1, the substrate including a plurality of levels to receive the first metal layer, the dielectric layer, and the interconnect, wherein the interconnect spans across the plurality of levels.

8. The apparatus of claim 7, wherein the plurality of levels is provided as a three dimensional patterned structure that is formable self-aligned in the substrate.

9. The apparatus of claim 1, wherein the interconnect is formed by a second metal layer, and the apparatus further comprises a crossover formed by the second metal layer disposed on the dielectric layer to provide an electrical conduction path across the dielectric layer.

10. An apparatus comprising:
    a raised feature;
    a dielectric layer disposed on the raised feature;
    a reflow via disposed in the dielectric layer at the raised feature, the reflow via formed by reflow of the dielectric layer;
    an interconnect in contact with the raised feature through the reflow via; and
    a substrate including a containment region to contain reflow of the dielectric layer.

11. The apparatus of claim 10, further comprising a first metal layer, wherein the raised feature is disposed on the first metal layer.

12. The apparatus of claim 10, further comprising a second metal layer disposed on the dielectric layer, wherein the interconnect is formed from the second metal layer.

13. A method, comprising:
    forming a dielectric layer on a first metal layer;
    reflowing the dielectric layer to form a reflow via;
    forming an interconnect with the first metal layer at the reflow via; and
    forming a substrate including a containment region to contain reflow of the dielectric layer.

14. The method of claim 13, wherein reflowing the dielectric layer comprises heating the dielectric layer at or above a glass transition temperature (Tg) during a baking process.

* * * * *

UNITED STATES PATENT AND TRADEMARK OFFICE
CERTIFICATE OF CORRECTION

PATENT NO. : 9,583,432 B2  
APPLICATION NO. : 14/762799  
DATED : February 28, 2017  
INVENTOR(S) : Kevin Dooley et al.

Page 1 of 1

It is certified that error appears in the above-identified patent and that said Letters Patent is hereby corrected as shown below:

On the Title Page

Item (54) and in the Specification, Column 1, Line 1, delete "DIELECRIC" and insert
-- DIELECTRIC --, therefor.

Signed and Sealed this
Twenty-third Day of May, 2017

Michelle K. Lee
*Director of the United States Patent and Trademark Office*